(12) United States Patent
Tamai et al.

(10) Patent No.: US 9,237,667 B2
(45) Date of Patent: Jan. 12, 2016

(54) WATERPROOF STRUCTURE FOR ELECTRONIC UNIT

(71) Applicant: JTEKT CORPORATION, Osaka-shi, Osaka (JP)

(72) Inventors: Toshio Tamai, Kashiwara (JP); Norio Nakatani, Nabari (JP); Takahiro Sanada, Kashihara (JP); Kensaku Hotta, Kashihara (JP)

(73) Assignee: JTEKT CORPORATION, Osaka (JP)

( * ) Notice: Subject to any disclaimer, the term of this patent is extended or adjusted under 35 U.S.C. 154(b) by 74 days.

(21) Appl. No.: 13/775,939

(22) Filed: Feb. 25, 2013

(65) Prior Publication Data

US 2013/0229097 A1 Sep. 5, 2013

(30) Foreign Application Priority Data

Mar. 1, 2012 (JP) .................................. 2012-045597

(51) Int. Cl.
*H05K 5/02* (2006.01)
*H01B 7/28* (2006.01)
*H01R 13/52* (2006.01)
*H05K 5/06* (2006.01)

(52) U.S. Cl.
CPC .............. *H05K 5/0247* (2013.01); *H01B 7/28* (2013.01); *H01R 13/5216* (2013.01); *H05K 5/069* (2013.01)

(58) Field of Classification Search
CPC ................................... H05K 5/02; H02G 3/08
USPC ........ 312/223.6; 174/50, 15.1–15.3, 21 R–29, 174/32–36, 74 R–84 S, 102 R–124 GC, 174/126.1–133 B; 361/679.01–679.45, 361/679.55–679.61, 724–747, 752–759, 361/796–837
See application file for complete search history.

(56) References Cited

U.S. PATENT DOCUMENTS 3,823,255 A * 7/1974 La Gase et al. ............ 174/113 R
4,533,201 A * 8/1985 Wasserlein, Jr. ............. 439/404
5,912,433 A * 6/1999 Pulido et al. ................ 174/77 R
6,225,557 B1 * 5/2001 Fonteneau et al. .............. 174/50

(Continued)

FOREIGN PATENT DOCUMENTS

DE 10 2008 031 085 A1 1/2010
DE 10 2009 006845 A1 8/2010

(Continued)

OTHER PUBLICATIONS

May 10, 2013 extended European Search Report issued in European Patent Application No. 13156757.0.

(Continued)

*Primary Examiner* — Courtney Smith
*Assistant Examiner* — Rashen E Morrison
(74) *Attorney, Agent, or Firm* — Oliff PLC

(57) ABSTRACT

A waterproof structure for an electronic unit includes a sub-case that defines an accommodating portion that accommodates a first terminal, and has a cable guiding hole that communicates with the accommodating portion. A potting resin filled in the accommodating portion is also filled in a space between a cable and the cable guiding hole. The cable includes a first sheath that covers a conductor and is made of a first resin material, and a second sheath that covers the first sheath. The second sheath and the potting resin are made of a second resin material that is different from the first resin material.

6 Claims, 7 Drawing Sheets

(56) References Cited

U.S. PATENT DOCUMENTS

| | | | |
|---|---|---|---|
| 6,344,612 B1* | 2/2002 | Kuwahara et al. | 174/50 |
| 6,627,817 B1* | 9/2003 | Kortenbach | 174/74 R |
| 7,507,905 B2* | 3/2009 | Kanamaru et al. | 174/50 |
| 8,033,408 B2* | 10/2011 | Makela et al. | 220/3.2 |
| 8,900,019 B2* | 12/2014 | Yamaguchi et al. | 439/747 |
| 2009/0086444 A1* | 4/2009 | Yoshikawa et al. | 361/752 |
| 2010/0047469 A1* | 2/2010 | Hilmer et al. | 427/536 |
| 2013/0229097 A1* | 9/2013 | Tamai et al. | 312/223.6 |

FOREIGN PATENT DOCUMENTS

| | | |
|---|---|---|
| JP | U-02-095283 | 7/1990 |
| JP | H03-106828 U | 11/1991 |
| JP | A-08-010255 | 1/1996 |
| JP | A-10-161989 | 6/1998 |
| JP | A-11-026065 | 1/1999 |
| JP | 2001-168368 A | 6/2001 |
| JP | 2002-044837 A | 2/2002 |
| JP | 2006-156094 A | 6/2006 |
| JP | 2011-205891 A | 10/2011 |

OTHER PUBLICATIONS

Jun. 12, 2015 Office Action issued in European Application No. 13 156 757.0.

Oct. 8, 2015 Office Action issued in Japanese Patent Application No. 2012-045597.

* cited by examiner

WATERPROOF STRUCTURE FOR ELECTRONIC UNIT

INCORPORATION BY REFERENCE/RELATED APPLICATION

This application claims priority to Japanese Patent Application No. 2012-045597 filed on Mar. 1, 2012 the disclosure of which, including the specification, drawings and abstract, is incorporated herein by reference in its entirety.

BACKGROUND OF THE INVENTION

1. Field of the Invention

The invention relates to a waterproof structure for an electronic unit.

2. Discussion of Background

Japanese Patent Application Publication No. 11-26065 (JP 11-26065 A) describes a waterproof structure for an electronic unit, which is configured by filling a case, into which a cable is drawn through a cable guiding hole, with a potting resin.

A sheath that constitutes an outer sheath of the cable, and the potting resin are made of different resin materials. Therefore, adhesion between the potting resin after curing and the sheath of the cable is not sufficiently high, which may reduce the waterproof performance.

SUMMARY OF THE INVENTION

The invention provides a waterproof structure for an electronic unit, which improves the waterproof performance of a cable guiding hole.

According to a feature of an example of the invention, a waterproof structure for an electronic unit, includes: a case that defines an accommodating portion that accommodates a first terminal, and that has a cable guiding hole that communicates with the accommodating portion; a cable that has a conductor connected to a second terminal to which the first terminal is connected, a first sheath that covers the conductor, and a second sheath that covers the first sheath, the cable being passed through the cable guiding hole and drawn into the accommodating portion; and a potting resin that is filled in the accommodating portion and a space between the cable and the cable guiding hole, the first sheath is made of a first resin material, and the second sheath and the potting resin are made of a second resin material that is different from the first resin material.

BRIEF DESCRIPTION OF THE DRAWINGS

The foregoing and further objects, features and advantages of the invention will become apparent from the following description of example embodiment with reference to the accompanying drawings, wherein like numerals are used to represent like elements and wherein.

DETAILED DESCRIPTION OF EMBODIMENTS

Hereinafter, embodiment of the invention will be described with reference to the accompanying drawings.

Figure 1:
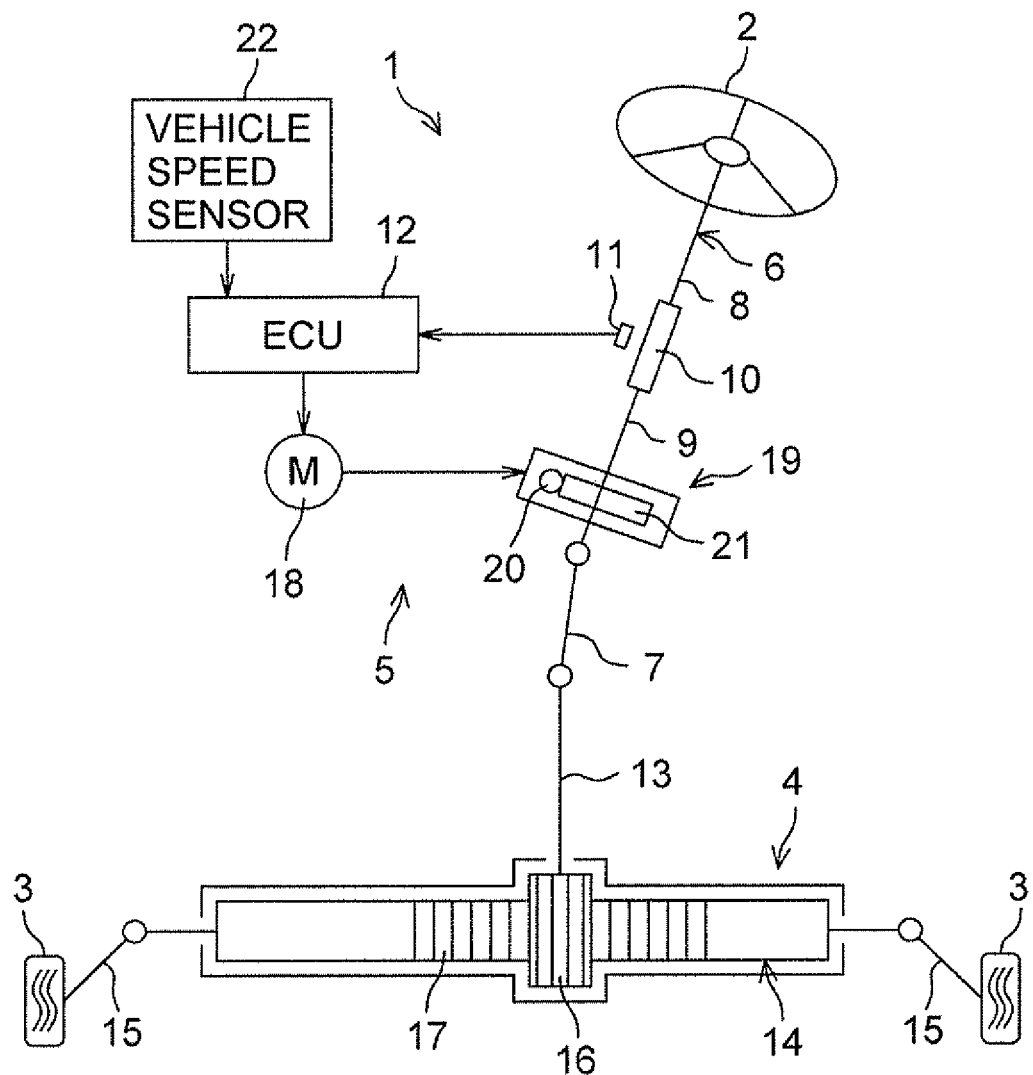
FIG. 1 is a schematic diagram showing the configuration of an electric power steering system to which a waterproof structure for an electronic unit according to an embodiment of the invention is applied.

FIG. 1 is a schematic diagram showing the configuration of an electric power steering system 1 that serves as a vehicle steering system to which a waterproof structure for an electronic unit according to an embodiment of the invention is applied. The electric power steering system 1 includes a steering wheel 2 that serves as a steering member, a steered mechanism 4 that steer steered wheels 3 in response to the rotation of the steering wheel 2, and a steering assist mechanism 5 for assisting a driver in performing a steering operation. The steering wheel 2 and the steered mechanism 4 are mechanically connected to each other via a steering shaft 6 and an intermediate shaft 7.

In the present embodiment, description will be provided on an example in which the steering assist mechanism 5 applies an assist force (steering assist force) to the steering shaft 6. However, the invention may be applied to a structure where the steering assist mechanism 5 applies an assist force to a pinion shaft (described later), or a structure where the steering assist mechanism 5 applies an assist force to a rack shaft (described later). The steering shaft 6 includes an input shaft 8 connected to the steering wheel 2, and an output shaft 9 connected to the intermediate shaft 7. The input shaft 8 and the output shaft 9 are coaxially connected to each other through a torsion bar 10 so as to be rotatable relative to each other.

A torque sensor 11 arranged around the steering shaft 6 detects a steering torque input into the steering wheel 2, based on a relative rotational displacement between the input shaft 8 and the output shaft 9. A torque detection result obtained by the torque sensor 11 is input into an ECU (electronic control unit) 12 that may function as an electronic unit. A vehicle speed detection result obtained by a vehicle speed sensor 22 is also input into the ECU 12. The intermediate shaft 7 connects the steering shaft 6 and the steered mechanism 4 to each other.

The steered mechanism 4 is formed of a rack-and-pinion mechanism that includes a pinion shaft 13 and a rack shaft 14 that serves as a steered shaft. The steered wheels 3 are connected to respective end portions of the rack shaft 14 via tie rods 15 and knuckle arms (not shown). The pinion shaft 13 is connected to the intermediate shaft 7. The pinion shaft 13 rotates in accordance with a steering operation of the steering wheel 2. A pinion 16 is provided at a distal end (lower end in FIG. 1) of the pinion shaft 13.

The rack shaft 14 extends linearly in the lateral direction of a vehicle. In an intermediate portion of the rack shaft 14, a rack 17 that meshes with the pinion 16 is formed. With the pinion 16 and the rack 17, the rotation of the pinion shaft 13 is converted into an axial movement of the rack shaft 14. By moving the rack shaft 14 in the axial direction, the steered wheels 3 are steered.

As the steering wheel 2 is steered (rotated), the rotation is transmitted to the pinion shaft 13 via the steering shaft 6 and the intermediate shaft 7. Then, the rotation of the pinion shaft 13 is converted into an axial movement of the rack shaft 14 by the pinion 16 and the rack 17. Thus, the steered wheels 3 are steered. The steering assist mechanism 5 includes an electric motor 18 for steering assist, and a speed reduction mechanism 19 for transmitting an output torque of the electric motor 18 to the steered mechanism 4. The speed reduction mechanism 19 includes a worm shaft 20 that serves as a drive gear (input shaft) to which a driving force of the electric motor 18 is input, and a worm wheel 21 that serves as a driven gear that meshes with the worm shaft 20.

The worm shaft 20 is connected to an output shaft (not shown) of the electric motor 18 via a joint (not shown). The worm shaft 20 is rotated by the electric motor 18. The worm wheel 21 is connected to the steering shaft 6 so as to be rotatable with the steering shaft 6. As the electric motor 18 rotates the worm shaft 20, the worm wheel 21 is rotated by the worm shaft 20, and the worm wheel 21 and the steering shaft 6 are rotated together with each other. Thus, a steering assist force is transmitted to the steering shaft 6.

The electric motor 18 is controlled by the ECU 12. The ECU 12 controls the electric motor 18 based on the torque detection result obtained from the torque sensor 11, the vehicle speed detection result obtained from the vehicle speed sensor 22, and the like. Specifically, the ECU 12 determines a target assist amount with the use of a map that stores the correlation between a torque and a target assist amount for each vehicle speed. Then, the ECU 12 controls the electric motor 18 such that an assist force generated by the electric motor 18 approaches the target assist amount.

Figure 2:
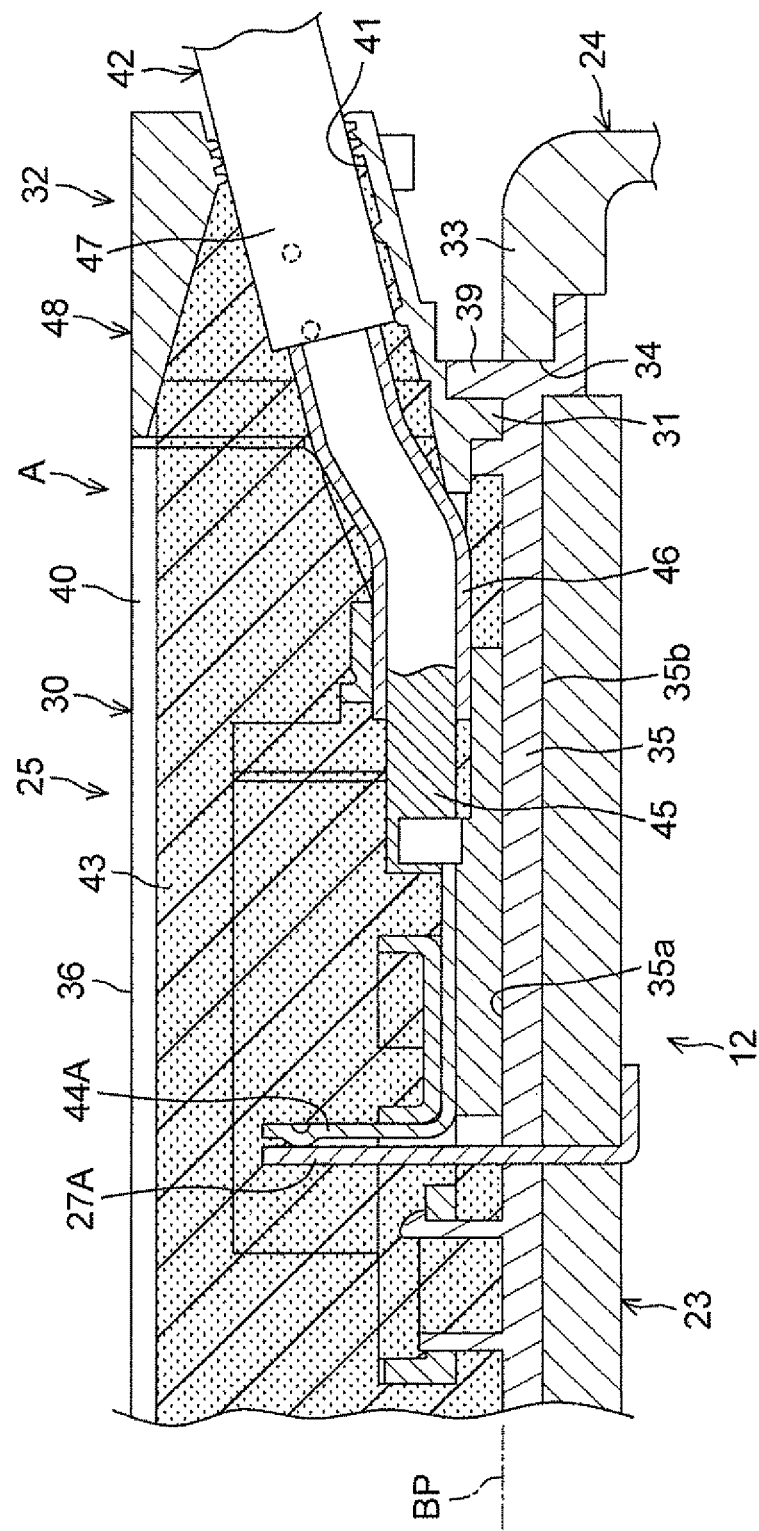
FIG. 2 is a sectional view of a main part of the waterproof structure for the electronic unit.

FIG. 2 is a sectional view of a waterproof structure A for an electronic unit. The ECU 12 is provided with a main case 24 and a sub-case 25. The main case 24 accommodates a substrate 23 and other electronic components (not shown), and is made of, for example, an aluminum alloy. The sub-case 25 is fixedly fitted to the main case 24, and is made of, for example, a synthetic resin.

Figure 3:
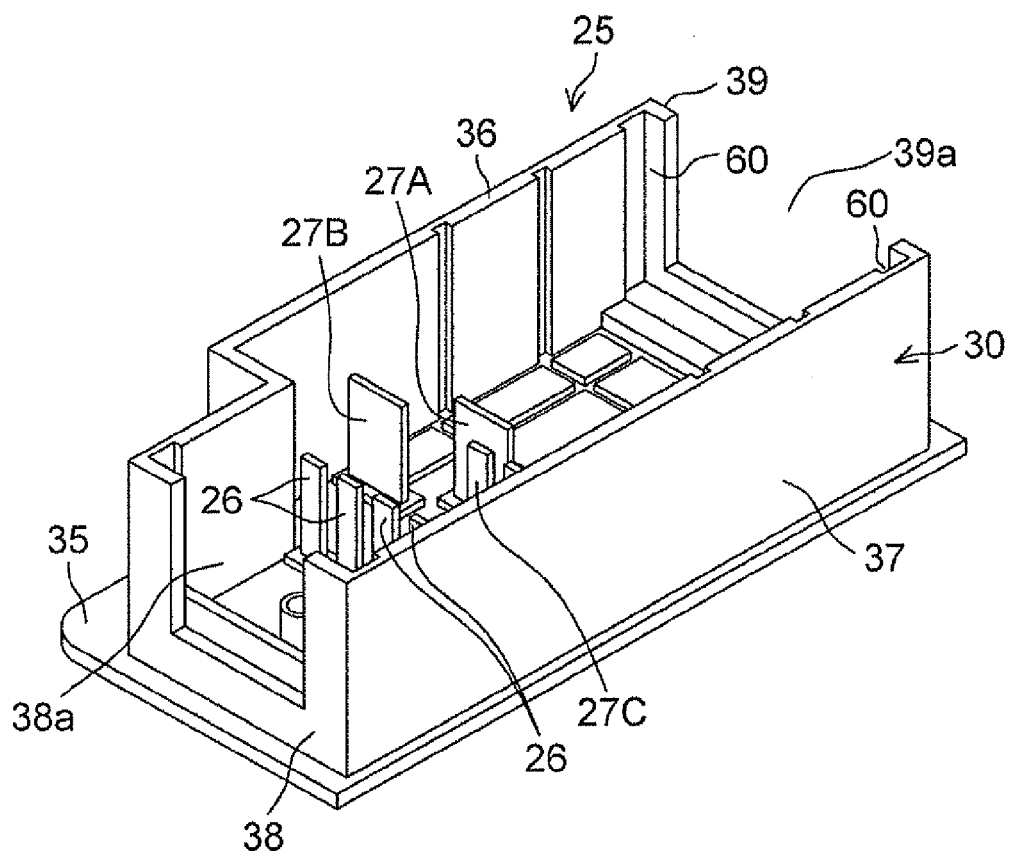
FIG. 3 is a perspective view mainly showing a sub-case body of the electronic unit.

As shown in FIG. 3, the sub-case 25 (a sub-case body 30 described later) accommodates a group of terminals 26 and first terminals 27A, 27B, 27C (collectively referred to as "first terminals 27" where appropriate). For example, terminals (not shown) provided at ends of wires, through which signals from the torque sensor 11 are input into the ECU 12, are connected to the terminals 26. A terminal provided at an end of a wire that transmits signals through an integrated ECU and a controller area network (CAN) on the vehicle side, a terminal provided at an end of a wire connected to a battery, and a terminal provided at an end of a wire connected to the earth are connected to the first terminals 27A, 27B, 27C, respectively.

Figure 4:
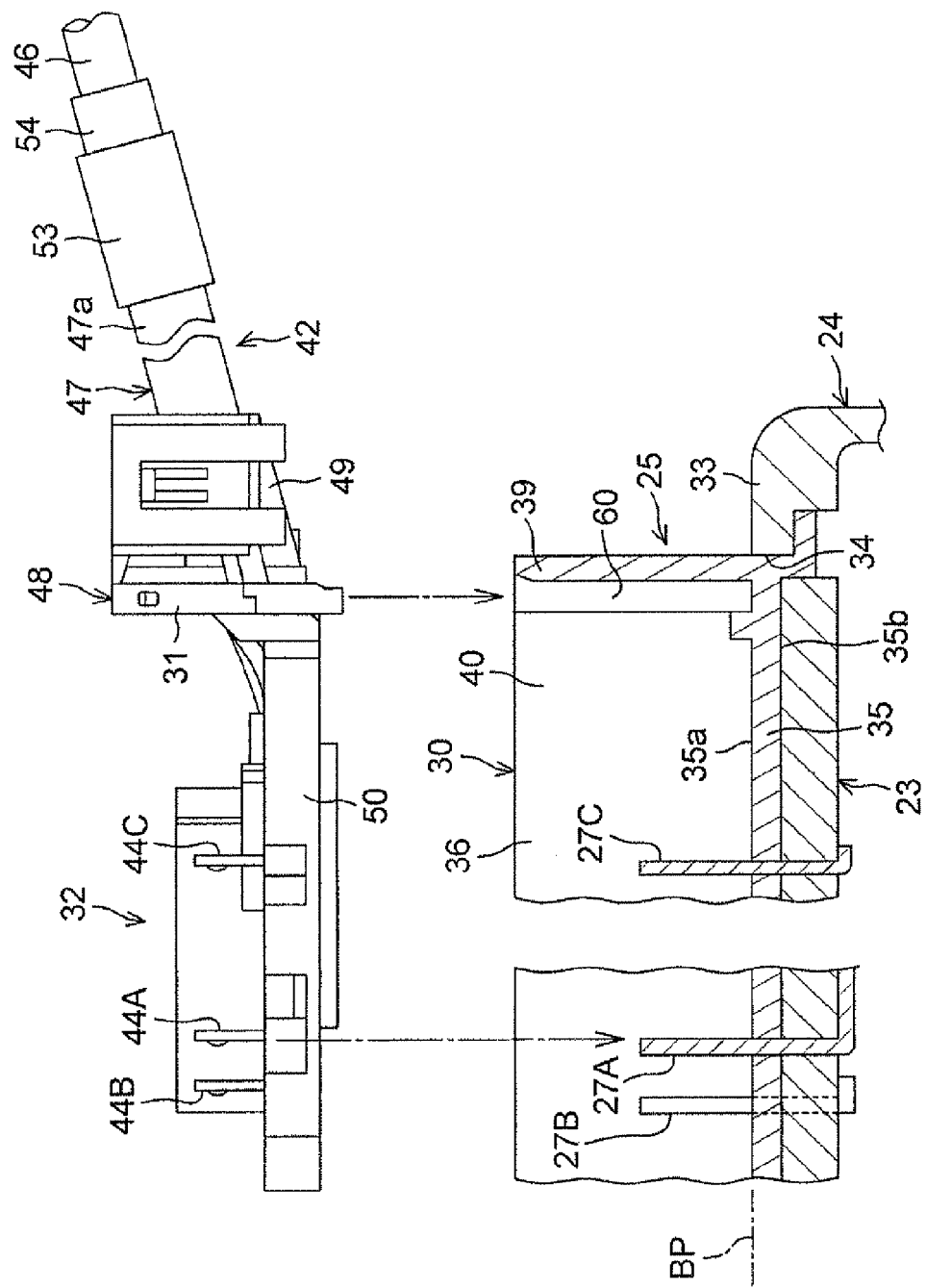
FIG. 4 is a side view of the waterproof structure for the electronic unit.

As shown in FIG. 4 which is a side view, the sub-case 25 is formed by assembling together the sub-case body 30 and a connector 32 that has a wall portion 31 that forms part of an outer wall of the sub-case 25. The sub-case body 30 has: a bottom plate 35 that covers, from the inside, a mounting hole 34 formed in an outer wall 33 of the main case 24 as shown in FIG. 2 and FIG. 4; a first wall 36 and a second wall 37 (see FIG. 3) that extend from the bottom plate 35 outward (upward in FIG. 2) of the main case 24 through the mounting hole 34; a third wall 38 that extends from the bottom plate 35 and has an opening 38a; and a fourth wall 39 that extends from the bottom plate 35 and has an opening 39a.

As shown in FIG. 2, the waterproof structure A for an electronic unit includes: the sub-case 25 that defines an accommodating portion 40 that accommodates, for example, the first terminals 27, and has cable guiding holes 41 that communicate with the accommodating portion 40; cables 42 drawn into the sub-case 25 through the cable guiding holes 41; and a potting resin 43 filled into the sub-case 25 and spaces between the cables 42 and the cable guiding holes 41. The potting resin 43 is filled into the sub-case 25 and the spaces in a liquid state, and then cured.

Main features of the present embodiment are that each cable 42 includes a conductor 45 that is connected to a second terminal 44A connected to a corresponding one of the first terminal 27, a first sheath 46 that covers the conductor 45, and a sleeve-like second sheath 47 that covers the first sheath 46, and that the space between (the second sheath 47 of) the cable 42 and the cable guiding hole 41 is filled with the potting resin 43. In other words, the second sheath 47 is molded by the potting resin 43 within the cable guiding hole 41. The first sheath 46 is made of a first resin material (for example, polyethylene), and the second sheath 47 and the potting resin 43 are made of a second resin material (for example, polyurethane) that is different from the first resin material.

As shown in FIG. 4, the sub-case body 30 covers the mounting hole 34, and also partially projects from the mounting hole 34. The first terminals 27A to 27C (only the first terminal 27A is shown in FIG. 2) that extend from the substrate 23 arranged in the main case 24 pass through the bottom plate 35 of the sub-case 25 and are accommodated in the accommodating portion 40. An upper face 35a of the bottom plate 35 forms a reference plane BP that is horizontally placed during resin potting where the potting resin in a liquid state is injected into the accommodating portion 40. The substrate 23 is held in a recessed portion 35b formed in a lower face of the bottom plate 35. One end of each of the first terminals 27A, 27B, 27C is connected to a conductive part of the substrate 23 within the main case 24.

As shown in FIG. 4, the connector 32 includes an insulator 48 attached to the sub-case 25, and the second terminals 44A, 44B, 44C that are supported by the insulator 48 and connected to the first terminals 27A, 27B, 27C, respectively. Each of the second terminals 44A, 44B, 44C has a portion to which the conductor 45 of a corresponding one of the cables 42 is connected, and a portion to which a corresponding on of the first terminals 27A, 27B, and 27C is connected. These portions are orthogonal to each other.

The insulator 48 includes the wall portion 31 that is fitted in an insertion groove 60 (see also FIG. 3) formed in the sub-case body 30, tubular cable guiding portions 49 connected to the wall portion 31, and a terminal holding portion 50 that extends from the wall portion 31, that is provided on the opposite side of the wall portion 31 from the cable guiding portions 49, and that supports the second terminals 44A to 44C. As shown in FIG. 2, the wall portion 31 forms part of the wall of the sub-case 25 and defines part of the accommodating portion 40 when the wall portion 31 is fitted to the sub-case body 30. The cable guiding portions 49 define the cable guiding holes 41 through which the cables 42 are drawn into the sub-case 25.

Figure 5:
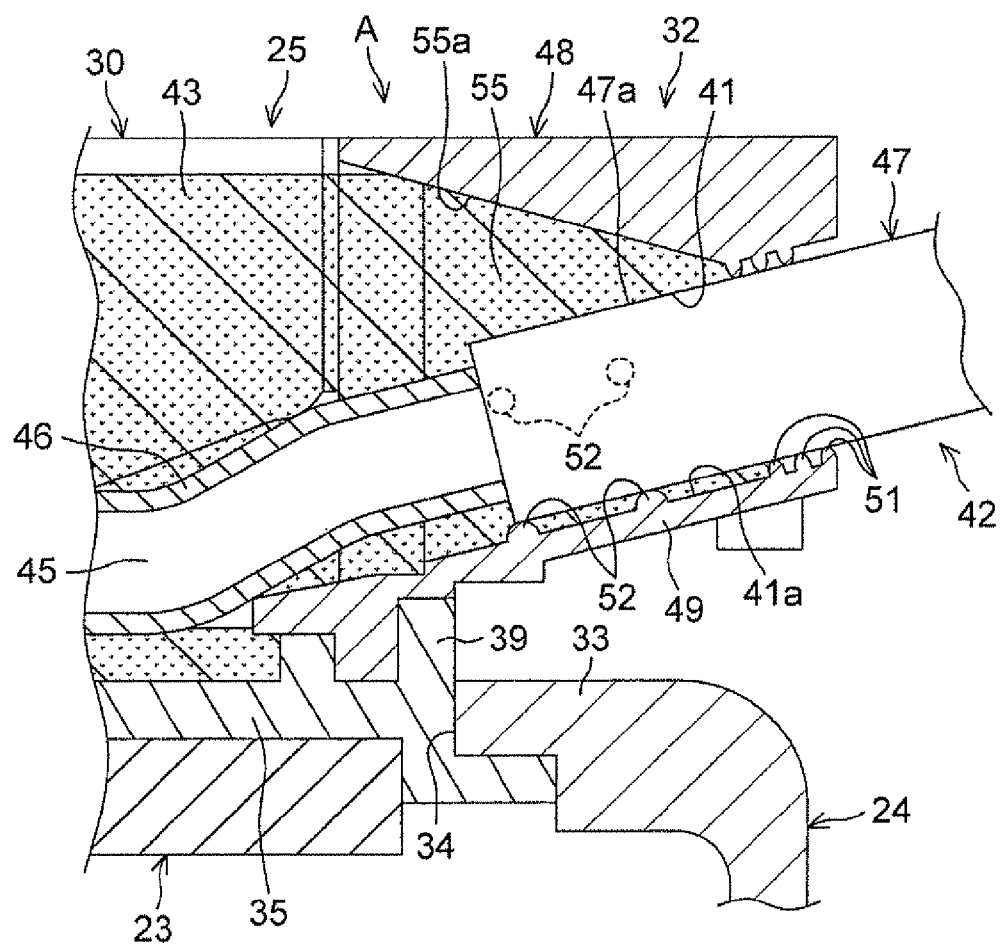
FIG. 5 is an enlarged sectional view of the main part of the waterproof structure for the electronic unit.
Figure 6:
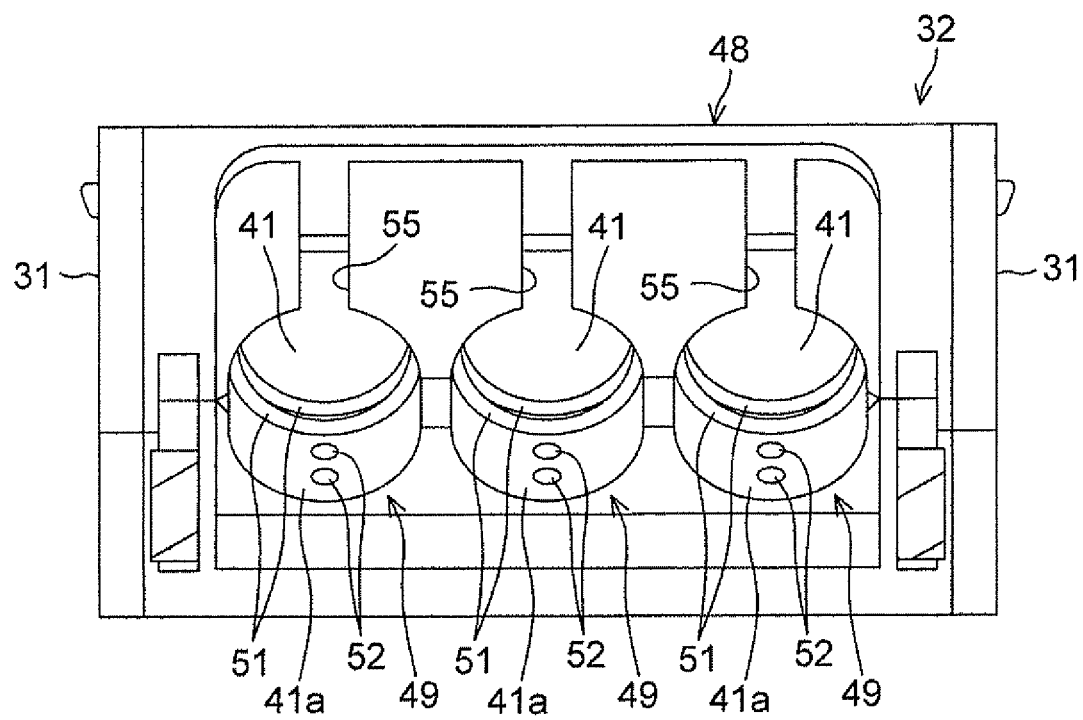
FIG. 6 is a schematic front view of an insulator of a connector that is attached to the sub-case body.
Figure 7:
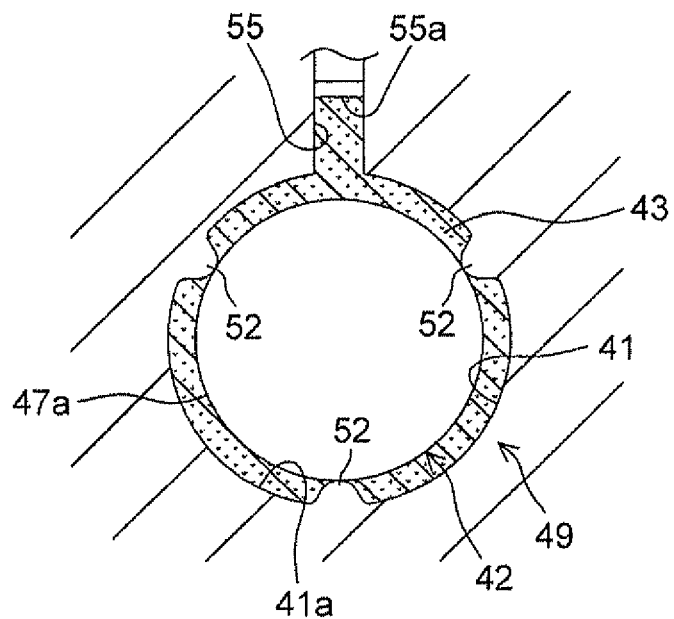
FIG. 7 is a sectional view of a cable passed through a cable guiding hole.

As shown in FIG. 5 and FIG. 6, an inner periphery 41a of an inlet of the cable guiding hole 41 is provided with at least one annular sealing projection 51 that closely contacts the outer periphery of a corresponding one of the cables 42 (the outer periphery corresponds to an outer periphery 47a of the second sheath 47). In addition, as shown in FIG. 5, FIG. 6 and FIG. 7, the inner periphery 41a of the cable guiding hole 41 is provided with a plurality of centering projections 52 (in the present embodiment, the centering projections 52 are formed at three positions in the circumferential direction and two positions in the axial direction, that is, six centering projections 52 are formed in total). The centering projections 52 are formed at equal intervals in the circumferential direction of the inner periphery 41a of the cable guiding hole 41. When the centering projections 52 contact the outer periphery of the cable 42 (the outer periphery 47a of the second sheath 47), the centering projections 52 function to perform centering of the cable guiding hole 41 and the cable 42.

Figure 8:
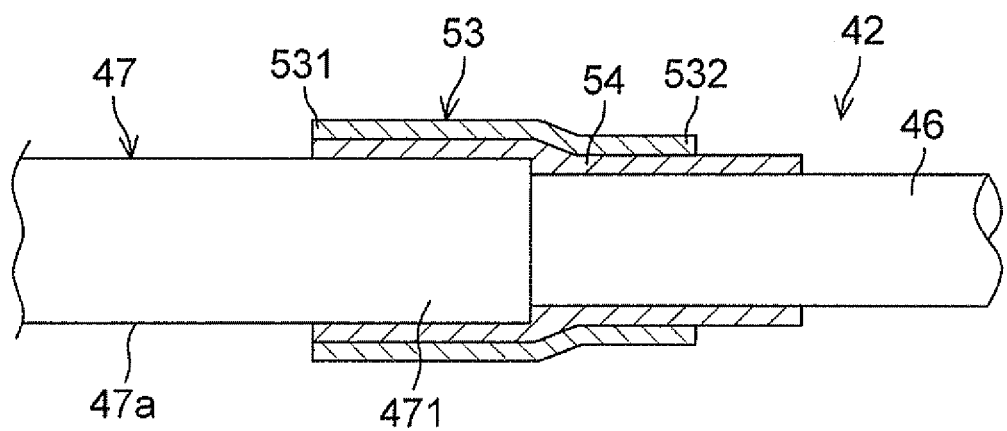
FIG. 8 is a sectional view showing an end portion of a second sheath of the cable and its surroundings.

As shown in FIG. 4 and FIG. 8, an end portion 471 of the second sheath 47 of each cable 42 (an end portion 471 of the second sheath 47, which is on the outer side of the sub-case 25), which is drawn out from the insulator 48, is covered together with the first sheath 46, by a heat shrinkable tube 53. A space between one end 531 of the heat shrinkable tube 53 and the second sheath 47, and a space between the other end 532 of the heat shrinkable tube 53 and the first sheath 46 are sealed by a hot melt adhesive 54.

As shown in FIG. 5, FIG. 6, and FIG. 7, each cable guiding hole 41 communicates, at a portion in the circumferential direction (upper portion), with a corresponding on of vertical grooves 55, and an internal upper face 55a of the vertical groove 55 is sloped such that the diameter of the vertical groove 55 increases toward the accommodating portion 40. Thus, when the potting resin 43 is supplied in a liquid state, it is possible to purge the air remaining in the cable guiding hole 41 from the cable guiding hole 41 through the vertical groove 55.

According to the present embodiment, the first sheath 46 that covers the conductor 45 of the cable 42 and is made of the first resin material is covered with the second sheath 47, and the second sheath 47 and the potting resin 43 are made of the same second resin material. Therefore, adhesion between the potting resin 43 and the outer periphery of the cable 42 (the outer periphery 47a of the second sheath 47) is remarkably improved in the cable guiding hole 41. As a result, it is possible to ensure high waterproof performance.

Because the end portion 471 of the second sheath 47 of the cable 42, which is on the outer side of the sub-case 25, is covered together with the first sheath 46 by the heat shrinkable tube 53, it is possible to reliably prevent water from entering the inner side of the second sheath 47. Thus, the waterproof performance is further improved. When the second resin material is polyurethane, the second material is able to fulfill a sufficient function as an outer sheath of the cable 42 and the potting resin 43.

When the first resin material is polyethylene, performances as an inner sheath of the cable 42, such as the strength and the insulation performance, are enhanced, and the cost is reduced. The centering projections 52 that project from the inner periphery 41a of the cable guiding hole 41 contact the outer periphery of the cable 42 (the outer periphery 47a of the second sheath 47) to perform centering of the cable guiding hole 41 and the cable 42. Thus, clearances having a uniform size are formed on the outer periphery of the cable 42, and the clearances are filled with the potting resin 43. Therefore, the sealing performance is remarkably improved.

The sealing projections 51 provided at the inlet of each cable guiding hole 41 closely contact the outer periphery of the cable 42 (the outer periphery 47a of the second sheath 47). Therefore, it is possible to suppress leakage of the potting resin that has entered the cable guiding hole 41 in a liquid state before curing. In addition, the space between the one end 531 of the heat shrinkable tube 53 and the second sheath 47, and the space between the other end 532 of the heat shrinkable tube and the first sheath 46 are sealed by the hot melt adhesive 54. Therefore, the sealing performance between the heat shrinkable tube 53 and each of the sheaths 46, 47 is significantly improved.

The invention is not limited to the above-described embodiment, and various changes may be made to the above-described embodiment within the scope of the appended claims.

What is claimed is:

1. A waterproof structure for an electronic unit, comprising: a case that defines an accommodating portion that accommodates a first terminal, and that has a cable guiding hole that communicates with the accommodating portion; a cable that has a conductor connected to a second terminal to which the first terminal is connected, a first sheath that covers the conductor, and a second sheath that covers the first sheath, the cable being passed through the cable guiding hole and drawn into the accommodating portion; and a potting resin that is filled in the accommodating portion and in a space between the cable and the cable guiding hole, wherein the first sheath is made of a first resin material, and the second sheath and the potting resin are made of a second resin material that is different from the first resin material; and a heat shrinkable tube that covers an end portion of the second sheath, which is on an outer side of the case, and the first sheath together with each other, thereby coupling the first and second sheaths at opposing ends.

2. The waterproof structure for an electronic unit according to claim 1, wherein the second resin material is polyurethane.

3. The waterproof structure for an electronic unit according to claim 1, wherein the first resin material is polyethylene.

4. The waterproof structure for an electronic unit according to claim 1, further comprising a plurality of centering projections that project from an inner periphery of the cable guiding hole and contact an outer periphery of the cable.

5. The waterproof structure for an electronic unit according to claim 1, further comprising at least one annular sealing projection that is arranged at an inlet of the cable guiding hole, and that closely contacts the outer periphery of the cable.

6. The waterproof structure for an electronic unit according to claim 1, wherein a space between one end of the heat shrinkable tube and the second sheath, and a space between the other end of the heat shrinkable tube and the first sheath are sealed by a hot melt adhesive.

* * * * *